United States Patent
Godfrin et al.

(10) Patent No.: US 11,035,766 B2
(45) Date of Patent: Jun. 15, 2021

(54) CRYOGENIC TRANSMISSION ELECTRON MICROSCOPY SAMPLE PREPARATION

(71) Applicant: NANOSOFT, LLC., Coventry, RI (US)

(72) Inventors: Michael Godfrin, Narragansett, RI (US); Michael Franzblau, Scituate, RI (US)

(73) Assignee: NANOSOFT, LLC., Coventry, RI (US)

( * ) Notice: Subject to any disclaimer, the term of this patent is extended or adjusted under 35 U.S.C. 154(b) by 0 days.

(21) Appl. No.: 16/790,367

(22) Filed: Feb. 13, 2020

(65) Prior Publication Data

US 2020/0264079 A1 Aug. 20, 2020

Related U.S. Application Data

(60) Provisional application No. 62/805,698, filed on Feb. 14, 2019.

(51) Int. Cl.
*G01N 1/42* (2006.01)
*G01N 1/28* (2006.01)
*G01N 1/40* (2006.01)
*H01J 37/28* (2006.01)

(52) U.S. Cl.
CPC ............. *G01N 1/42* (2013.01); *G01N 1/2813* (2013.01); *G01N 1/40* (2013.01); *H01J 37/28* (2013.01); *G01N 2001/4027* (2013.01); *H01J 2237/2002* (2013.01); *H01J 2237/2802* (2013.01)

(58) Field of Classification Search
CPC .. G01N 1/312; G01N 1/00; G01N 2223/3103; G01N 1/42; G01N 1/2813; G01N 1/40; H01J 37/28
USPC ........................................... 73/863.12, 864.91
See application file for complete search history.

(56) References Cited

U.S. PATENT DOCUMENTS

| | | |
|---|---|---|
| 4,753,887 A | 6/1988 | Bellare et al. |
| 7,413,872 B2 | 8/2008 | Frederik et al. |
| 9,312,095 B2 | 4/2016 | Tripathi et al. |
| 9,355,813 B2 | 5/2016 | Bose et al. |
| 9,594,008 B2 | 3/2017 | Carragher et al. |

(Continued)

FOREIGN PATENT DOCUMENTS

| | | |
|---|---|---|
| EP | 2211163 B1 | 9/2015 |
| EP | 3018467 A1 | 5/2016 |

(Continued)

OTHER PUBLICATIONS

Drulyte et al "Approaches to altering particle distributions in cryo-electron microscopy sample preparation" Acta Crystallographica Section D—Structural Biology74: 560-571. Int Union Crystallography. (Jun. 2018) (Year: 2018).*

(Continued)

*Primary Examiner* — Nimeshkumar D Patel
*Assistant Examiner* — Jean F Morello
(74) *Attorney, Agent, or Firm* — Adler Pollock & Sheehan P.C (57) ABSTRACT

A method includes introducing a fluidic sample into a void volume of a porous material, bringing the porous material into contact with a hydrophilic substrate compatible with a cryogenic Transmission Electron Microscope, separating the porous material from the substrate, and transferring a portion of the sample from the porous material to the substrate between their contact and separation.

6 Claims, 6 Drawing Sheets

(56) References Cited

U.S. PATENT DOCUMENTS

| | | |
|---|---|---|
| 9,702,795 B2 | 7/2017 | Carragher et al. |
| 9,865,428 B2 | 1/2018 | Remigy |
| 10,770,265 B1 | 9/2020 | Mcqueen et al. |
| 10,866,172 B2 | 12/2020 | Mcqueen et al. |
| 2010/0181495 A1 | 7/2010 | Lihl et al. |
| 2012/0241607 A1* | 9/2012 | Bose ............... H01J 37/20 250/307 |
| 2013/0205808 A1* | 8/2013 | Mulders .............. G01N 1/42 62/62 |
| 2017/0004953 A1 | 1/2017 | Glaeser et al. |
| 2019/0170625 A1 | 6/2019 | Nijpels et al. |

FOREIGN PATENT DOCUMENTS

| | | |
|---|---|---|
| WO | 2017/005297 A1 | 1/2017 |
| WO | 2017/220750 A1 | 12/2017 |
| WO | 2018/073242 A1 | 4/2018 |
| WO | 2020/171764 A1 | 8/2020 |

OTHER PUBLICATIONS

Arnold, et al., "Blotting-Free and Lossless Cryo-Electron Microscopy Grid Preparation From Nanoliter-Sized Protein Samples and Single-cell Extracts", Journal of Structural Biology, vol. 197, Issue 3, 2017, pp. 220-226.

Bellare, et al., "Controlled Environment Vitrification System: An Improved Sample Preparation Technique", Journal of Electron Microscopy Technique, vol. 10, 1988, pp. 87-111.

Croote, et al., "A Platform for Retaining Native Morphology at Sub-Second Time Scales in Cryogenic Transmission Electron Microscopy", Review of Scientific Instruments, vol. 84, Issue 5, 2013, 6 pages.

Dandey, et al., "Spotiton: New Features and Applications", Journal of Structural Biology, vol. 202, Issue 2, 2018, pp. 161-169.

Feng, et al., "A Fast and Effective Microfluidic Spraying-Plunging Method for High-resolution Single-Particle Cryo-EM", Structure, vol. 25, Issue 4, Apr. 4, 2017, pp. 663-670.

Jain, et al., "Spotiton: A Prototype for an Integrated Inkjet Dispense and Vitrification System for Cryo-TEM", Journal of Structural Biology, vol. 179, Issue 1, Jul. 2012, pp. 68-75.

Mcdowall, et al., "Electron Microscopy of Frozen Hydrated Sections of Vitreous Ice and Vitrified Biological Samples", Journal of Microscopy, vol. 131, Issue 1, Jul. 1983, pp. 1-9.

Noble, et al., "Reducing Effects of Particle Adsorption to the Air-Water Interface in CryoEM", Nature Methods, vol. 15, Issue 10, Oct. 2018, 10 pages.

Razinkov, et al., "A New Method for Vitrifying Samples for CryoEM", Journal of Structural Biology, vol. 195, 2016, pp. 190-198.

Klebl et al., "Need for Speed: Examining Protein Behavior During Cryoem Grid Preparation at Different Timescales", Structure, vol. 28, Issue 11, Nov. 3, 2020, pp. 1238-1248.

Klebl et al., "Sample deposition onto cryo-EM grids: from sprays to jets and back", Acta Crystallographica Section D, Structural Biology, vol. 76, Apr. 2020, pp. 340-349.

Ravelli et al., "Cryo-em Structures From Sub-nl Volumes Using Pin-printing and Jet Vitrification", Nature Communications, vol. 11, May 22, 2020, pp. 1-9.

* cited by examiner

Introduce a fluidic sample into a void volume of a porous material
502

Bring the porous material into contact with a hydrophilic substrate compatible with a cryogenic Transmission Electron Microscope
504

Separate the porous material from the substrate
506

Transfer a portion of the sample from the porous material to the substrate between their contact and separation
508

Load a hydrophilic porous material with a volume of fluidic sample wherein a portion of a void space of the hydrophilic porous material is filled with the fluidic sample
602

↓

Process a substrate for cryo-Transmission Electron Microscope samples to be rendered hydrophilic
604

↓

Bring the porous material into contact with a surface of the substrate, causing a volume of sample transferred from the hydrophilic porous material to the substrate
606

↓

Separate a surface of the porous material from the surface of the substrate
608

↓

Plunge the substract into a liquid cryogen for sample vitrification
610

FIG. 6

CRYOGENIC TRANSMISSION ELECTRON MICROSCOPY SAMPLE PREPARATION

CROSS REFERENCE TO RELATED APPLICATIONS

This application claims benefit from U.S. Provisional Patent Application Ser. No. 62/805,698, filed Feb. 14, 2019, which is incorporated by reference in its entirety.

STATEMENT REGARDING GOVERNMENT INTEREST

This invention was made with government support under Grant No. NSF 1746430 awarded by the National Science Foundation. The government has certain rights to the invention.

BACKGROUND OF THE INVENTION

The present invention relates generally to Transmission electron microscopy, and more particularly to cryogenic transmission electron microscopy sample preparation.

In general, Transmission electron microscopy (TEM) is a microscopy technique whereby a beam of electrons is transmitted through an ultra-thin specimen such that the electron beam interacts with the specimen as it passes through. The interaction of the electrons transmitted through the specimen in turn creates an image. This created image is then magnified and focused onto an imaging device, such as a fluorescent screen, a layer of photographic film, or is detected by a sensor such as a CCD camera. The benefit is that TEM systems are capable of imaging at a significantly higher resolution than traditional light microscopes due to the small wavelength of electrons. This enables the instrument's user to examine sample features with atomic-level resolution, which is thousands of times more powerful than light microscopes.

TEM forms a major analysis method in a range of scientific fields, in both physical and biological sciences. TEM specimens must be prepared on gridded substrates, which are loaded into a sample holder. Usual grid substrate materials are copper, molybdenum, gold or platinum. The sample holder can then be inserted into the TEM column which is under vacuum; in the column the holder pairs with a specimen stage which allows for translation and rotation of the sample. A wide variety of designs of stages and holders exist, selection of which depends on the type of specimen and experiment.

SUMMARY OF THE INVENTION

The following presents a simplified summary of the innovation in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In general, in one aspect, the invention features a method including introducing a fluidic sample into a void volume of a porous material, bringing the porous material into contact with a hydrophilic substrate compatible with a cryogenic Transmission Electron Microscope, separating the porous material from the substrate, and transferring a portion of the sample from the porous material to the substrate between their contact and separation.

In another aspect, the invention features a method including loading a hydrophilic porous material with a volume of fluidic sample wherein a portion of a void space of the hydrophilic porous material is filled with the fluidic sample, processing a substrate for cryo-Transmission Electron Microscope samples to be rendered hydrophilic, bringing the porous material into contact with a surface of the substrate, causing a volume of sample transferred from the hydrophilic porous material to the substrate, separating a surface of the porous material from the surface of the substrate, and plunging the substract into a liquid cryogen for sample vitrification.

In still another aspect, the invention features a method including a blotless technique for depositing fluidic sample onto a substrate for cryo-Transmission Electron Microscope.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

These and other features, aspects, and advantages of the present invention will become better understood with reference to the following description, appended claims, and accompanying drawings where:

DETAILED DESCRIPTION

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

The present invention is a process for preparing samples for cryogenic transmission electron microscopy. A fluidic sample is introduced into the void volume of a porous material. The porous material is brought into contact with a hydrophilic substrate compatible with a cryogenic Transmission Electron Microscope. The porous material is then separated from the substrate, and between contact and separation a portion of sample is transferred from the porous material to the substrate. Upon separation of the porous material and substrate, the substrate, now containing a deposited volume of sample, is vitrified with a cryogen. The volume deposited is appropriate for vitrification for cryo-TEM imaging, eliminating the need to remove excess sample volume, a practice ubiquitous in cryo-TEM sample preparation.

Cryogenic Transmission Electron Microscopy (cryo-TEM) relies on cryogenic sample preparation of fluidic samples prior to imaging with a TEM, which synergistically provides native images of hydrated materials (e.g., proteins, enzymes, nanomaterial suspensions, etc.) with the resolution advantages of TEM. Cryogenic sample preparation requires the vitrification of the fluidic material, where vitrification is the freezing of a water-based sample fast enough such that water molecules do not crystallize but rather remain amorphous. Crystallization of water results in damage to the molecules/particles/nanomaterials of interest in solution or suspension and result in poor images due to water crystals. The ubiquitous method used to vitrify samples for cryo-TEM has been to pipette fluidic sample onto a TEM sample grid, blot the grid with blotting paper for a finite time period to remove excess sample, and then quickly plunge the grid into a liquid cryogen. The blot is used to reduce the sample volume on the grid (generally to a layer≤100 nm thick) such that the heat transfer rate from the sample fluid to the cryogen vitrifies the sample fluid.

The blotting process entails pushing a porous blotting paper against the TEM grid, on which the droplet of sample resides. Fluid from the sample wicks through the pores of the blotting paper, removing fluid volume from the sample droplet which replaces air within the pores of the paper. The removal of fluid from the grid through the blot is a function of many parameters, including the type of blotting paper used, pre-saturation of blotting paper due to humidity in the ambient environment, force with which the blotting paper is applied against the sample, sample properties, etc. These parameters must be set appropriately such that a layer of sample on the grid is left behind with a thickness of 100 nm, with the optimal layer thickness being dependent on the sample being analyzed.

Studies generally rely on multiple replicates of data to build confidence in observations; therefore, many TEM grids are conventionally prepared for imaging and data collection. This is especially important for Single Particle analysis with cryo-EM, whereby thousands of images of many replicates of a biomacromolecule in a variety of random orientations are compiled to create a 3D construction of the molecular structure. Good repeatability of the blotting process is important so that when blotting parameters are set to prepare grids, the user can be confident that using those same parameters will provide similar grids when repeating the process. This is important because a large amount of funds, time and effort are spent in the purification of biomacromolecules before cryo-TEM sample preparation can even occur; small volumes of these samples are incredibly valuable and difficult to achieve. Unfortunately, it has been reported that the blotting process is not repeatable. Even commercially-available blotting-based sample preparation robots, which have been developed to offer improved blotting control and repeatability, have been reported to not be repeatable; subsequent samples prepared on the same machine with the same sample material and same blotting parameters, within minutes of each other, can still result in completely different vitrification results. Because of this poor repeatability, and the expense of, and demand for, time for use of high end data collection TEM's, it is required that researchers use lower end TEM's and optimize blotting conditions on those "screening TEMs". The inefficiency of blotting, results in the need for additional screening TEM's (both their purchase and maintenance) and the additional use of valuable sample volume and researcher time to optimize those parameters. It has been reported that some samples have required multiple years in optimization of cryo-TEM sample preparation, clearly showing that new cryo-TEM sample preparation technologies are required to drive cryo-EM to a high throughput technique.

Other major issues with blotting-based cryo-TEM sample preparation exist. As stated, biomacromolecule samples (often proteins or protein complexes) are incredibly expensive to synthesize; it requires complex processing and often results in small volumes with which imaging can be conducted. Blotting-based cryo-TEM sample preparation has required users to deposit ~3-5 μL of sample onto the grid by pipetting and the blotting process results ideally with ~100's pL remaining on the grid. This means more than 99.9% of the valuable sample is blotted away from the grid, which can not be recovered or used again. Sample preparation techniques that can minimize the amount of sample waste would be of huge benefit for cryo-TEM.

Furthermore, blotting-based sample preparation requires time scales on the order of seconds. For single particle cryo-EM, the protein particle must be randomly oriented throughout the sample in order to ascertain images of a variety of perspectives of the protein. This variety of two dimensional perspectives provides the ability to construct a three dimensional model of the protein. It has been reported that proteins will preferentially move to the air/water interface which leads to a preferred orientation and reduced ability to calculate a three-dimensional structure. It has been reported that if the time interval between the creation of the air/water interface and vitrification is maintained at equal to or less 100-250 msec, the particles will have significantly less ability to move to the air/water interface and adopt a preferred orientation. Furthermore, faster sample preparation process will allow for better temporal resolution for studies into dynamic processes, such as biological interactions, e.g. protein-protein binding, or other chemical processes, e.g. reaction intermediates in mixing. There is certainly a major benefit to reducing the time between sample deposition and vitrification when preparing a sample for cryo-TEM.

Blotless techniques generally indicate that the sample is applied to the grid with a volume small enough that the sample can be vitrified without removal of any excess volume post deposition. Several spray-techniques have been developed and reported upon. With these technologies picoliter to nanoliter volumes of sample are ejected onto the TEM grid prior to vitrification. The ejection has been driven with mechanical systems based on piezoelectric pump heads, as utilized for jet printers, and pneumatic spray. These systems eject an appropriate amount of sample, such that removal of excess sample volume is not required. These systems also claim to reduce time from sample formation to vitrification such that interfacial adsorption of particles is reduced. These systems utilize fluidic channels to guide the sample fluid and although volumes are dispensed onto the grid that are appropriate for vitrification without blotting, the systems generally require much higher volumes (~1 uL) to work in the practical manifestation of the system. These systems are also very complex and result in systems that are very expensive to manufacture and purchase. These complex systems also only use one spray head, which results in only a small fraction of the grid being covered with sample. If there is a desire to cover the entire grid, more complexity will be required for the system. Furthermore, they require complex machinery, which results in a large system, which is often difficult to house in sample preparation laboratories that exist in Electron Microscopy facilities. Therefore, there will be a need for additional forms of blotless sample preparation.

There is another type of blotless cryo-TEM sample preparation that utilizes a microcapillary to deposit sample onto the grid. Two processes are utilized with the microcapillary to deposit sample onto the grid. One entails a microcapillary tube into which sample is aspirated. The tip of the tube is brought close to the TEM grid and a high-precision pump ejects a ~20 nL droplet of sample from the tip. The droplet contacts the grid and there can be relative motion to get the sample to spread across the grid surface. The droplet is then reaspirated and the grid is plunged for vitrification. The reaspiration results in reduced waste from sample preparation. The second process entails dipping a microcapillary pin into the sample and the tip is the written across the surface of a TEM grid. The writing process transfers sample onto the grid, and the grid is plunged into liquid cryogen and vitrified. In both processes a laser and photodiode are utilized to monitor sample layer thickness on the grid post-deposition with the microcapillary; monitored evaporation utilizing controlled temperature is allowed to ensure the sample layer in an appropriate thickness for vitrification. Evaporation can have negative impacts on fluidic samples; it can alter salt concentrations and particle concentrations, which can lead to a conformational and/or structural changes. Furthermore, controlled evaporation monitoring systems add complexity to the sample preparation process and can lead to higher manufacturing costs. Therefore, additional blotless cryo-TEM sample preparation techniques will be of interest.

The present invention is a blotless technique for depositing fluidic sample onto a substrate for cryo-TEM. A hydrophilic porous material is loaded with a volume of fluidic sample, whereby some portion of the void space of the porous material is filled with the sample. Fluidic sample can comprise up to 100% of the void space, or more than 100% if the porous material is over-saturated. Separately, a substrate for cryo-TEM samples is processed to be rendered hydrophilic. The porous material is brought into contact with the surface of the hydrophilic sample substrate. Upon the porous material and sample substrate making contact, there can be shearing motion between the surfaces. The porous material and sample substrate are then separated; this separation can occur in any way, whether normal to the substrate surface or parallel (shear). Due to the hydrophilic nature of the sample substrate, a volume of sample is transferred from the porous material to the substrate. This transfer may occur during the initial contact, relative shearing action between the porous material and substrate (if conducted), and/or separation of the porous material and substrate. The properties of the TEM substrate (geometry, hydrophilicity, etc.), porous material (void space, material, thickness, etc.) and transfer process (with shear or without shear, normal or shear separation between substrate and porous material, volume of sample inserted into porous material) can be set appropriately for the properties of the sample of interest such that a volume is transferred to the substrate that is appropriate for vitrification without any blotting of excess sample volume. After separation of the surfaces, the substrate is plunged into a liquid cryogen for sample vitrification.

Referring now to the drawings, porous materials are materials that contain pores, or void space. Typically there is a solid, elastic material(s) that creates the matrix, which provides the mechanical structure to the porous material. The matrix can also be more viscoelastic, such as in some foams or gels. The pore or void space is often filled with air or gas, but can also be filled with fluid. The matrix and pore space may often be bicontinuous, but in some cases the matrix may be composed of discrete fibers. Porous materials include, but are not limited to: paper, cellulose filters, sponges, soil, rocks, bones, cork. Porous materials are complex and therefore fluid flow in them is modeled in a variety of ways, including as a network of capillaries or channels. Therefore, the porous material in these drawings is depicted as a solid body with horizontal channels through the body. This invention is however equally applicable to any type of hydrophilic porous material, whether natively or rendered as such.

Referring to the TEM sample substrate, generally cryo-TEM samples are deposited onto a TEM grid. The sample is deposited onto a thin carbon film, which is bound to and spread across a grid (film and grid together are colloquially referred to as the TEM grid). The grid component provides mechanical, structural stability while undergoing the sample preparation processes. The grid structure is ~3 mm in diameter and approximately 10-100 μm thick and is manufactured to be a grid pattern across the majority of the structure. While providing structure, the grid is also mostly empty space through which electrons can travel. The carbon film provides a relatively inert structure onto which the sample is deposited, while also allowing electrons to transfer through the film relatively easily; for cryo-TEM the film often contains holes into which the fluidic sample can deposit. The carbon film and substrate are generally rendered hydrophilic utilizing plasma treatment to encourage spreading of the sample across the carbon film surface. This invention is equally applicable to any substrate that is hydrophilic, whether natively or rendered as such, and whether of a grid/film architecture or not. It is also equally applicable to any type of grid material, generally a metal such as copper, gold or nickel, and any thin film used to frame vitrified sample for TEM imaging.

Referring to the sample, it is generally described as being fluidic. Whereas fluids react to stresses in a viscous manner, solid materials react to stresses in an elastic manner. Many samples for cryo-TEM are solutions or suspensions of particles that are dilute enough to behave like a fluid. However, this invention is equally applicable to any polar or water-based viscous, Non-Newtonian, viscoelastic, solution or colloidal suspension sample. It is also applicable to any type of particle, including proteins or other biomacromolecules, polymer particles, inorganic particles, and so forth.

Figure 1:
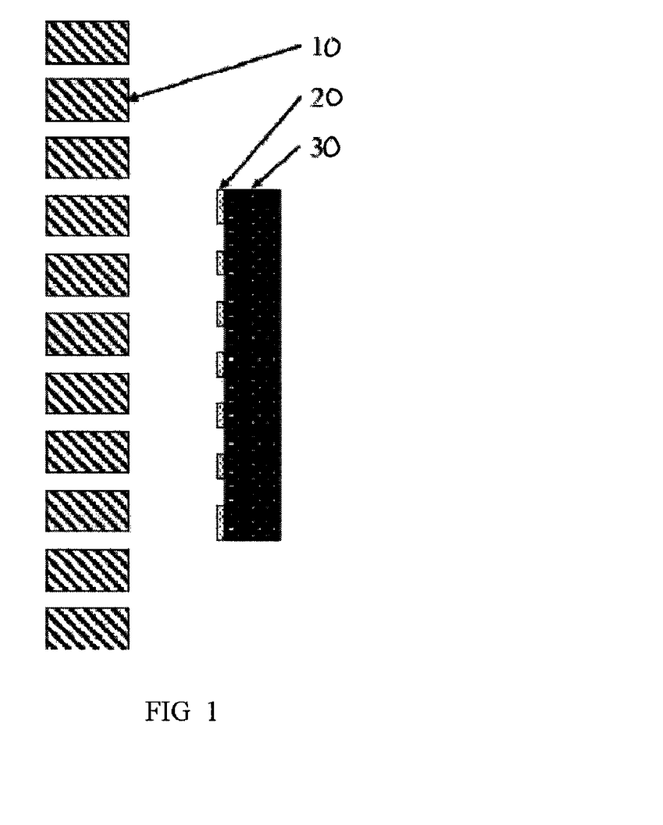
FIG. 1 is a side view showing the porous material and the TEM sample substrate before contact.

In FIG. 1, a porous material 10 is depicted in two dimensions as a material with capillaries running parallel through the material's thickness. Porous materials can be modeled as a material with a series of capillaries through which fluid flows, and to describe this invention, are depicted here as such rather than a complex three dimensional material. In this initial state the pores are empty, filled with ambient air. FIG. 1 depicts the porous material as a flat sheet, however the present invention applies equally to any geometry of porous material. A carbon film 20 is attached to the TEM grid 30. The carbon film and TEM grid are rendered hydrophilic.

Figure 2:
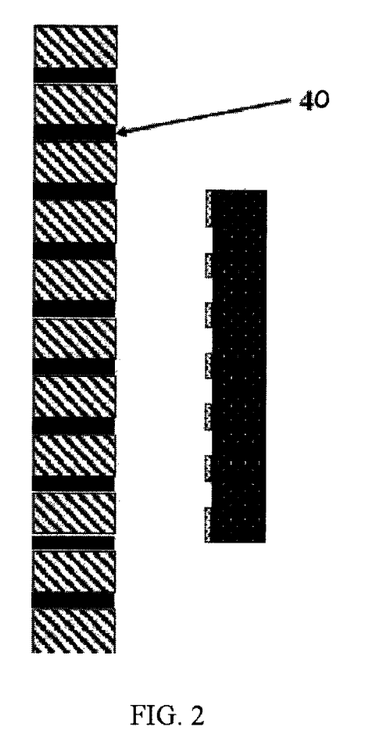
FIG. 2 is a side view showing the porous material with sample volume absorbed into the void space along with the TEM sample substrate, before contact.

In FIG. 2, a volume of sample is deposited into the porous material. The sample volume 40 occupies some portion of a void space in the pores of the porous material. FIG. 2 shows a sample volume approximately equal to the void space, however the present invention is equally applicable to any sample volume up to the volume of the void space (100% of void space is full, i.e., porous material is saturated), or a volume of sample even larger than the void space (porous material is over-saturated).

Figure 3:
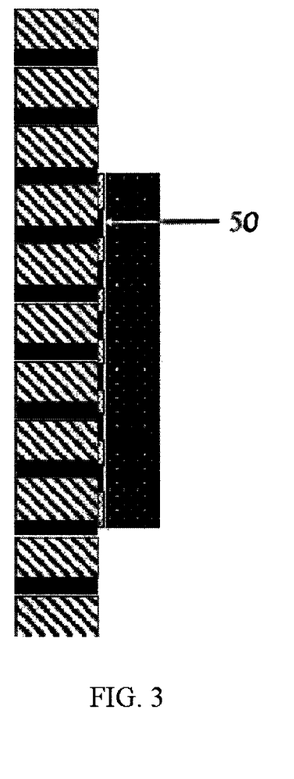
FIG. 3 is a side view showing contact and the transfer of sample between the porous material containing sample and the TEM sample substrate.

In FIG. 3, the porous material is brought into contact with the TEM grid on the carbon film side. This shows the porous material contacting flat onto the carbon, however the present invention applies equally to any contact type, such as the edge of the porous material contacting the carbon. As contact occurs, there may be shearing motion between the porous material and TEM substrate to encourage transfer of sample onto the carbon film. During contact there is sample volume that is transferred from the porous material to the TEM grid 50. Some sample may have sheared completely away from the porous material, and some sample volume may be in contact with both porous material and TEM substrate.

Figure 4:
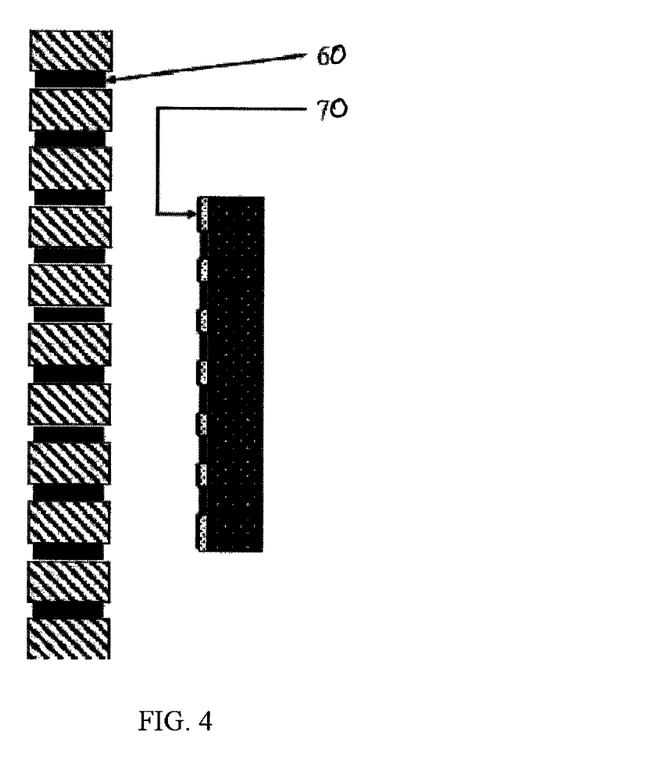
FIG. 4 is a side view showing the TEM sample substrate with transferred sample on the surface before being plunged into a liquid cryogen.

In FIG. 4, the porous material is separated from the TEM substrate. The sample volume 60 in the porous material is now less than the original sample volume 40 (FIG. 2), as a portion has been transferred to the TEM substrate 70. The objective is to transfer ~100's pL to ~1 nL of sample onto the TEM grid to achieve an appropriate sample layer thickness for vitrification. It should be noted that volumes depicted being transferred/deposited in the figures may be exaggerated and are for conceptual understanding only. The present invention does apply equally to any sized geometry of porous material, material porosity, porous material type, void space volume, sample volume and so forth. Additionally, sample volume 70 is depicted as having a uniform thickness across the carbon film and pores in the film, however the present invention will often lead to variation in the sample thickness across the grid.

Figure 5:
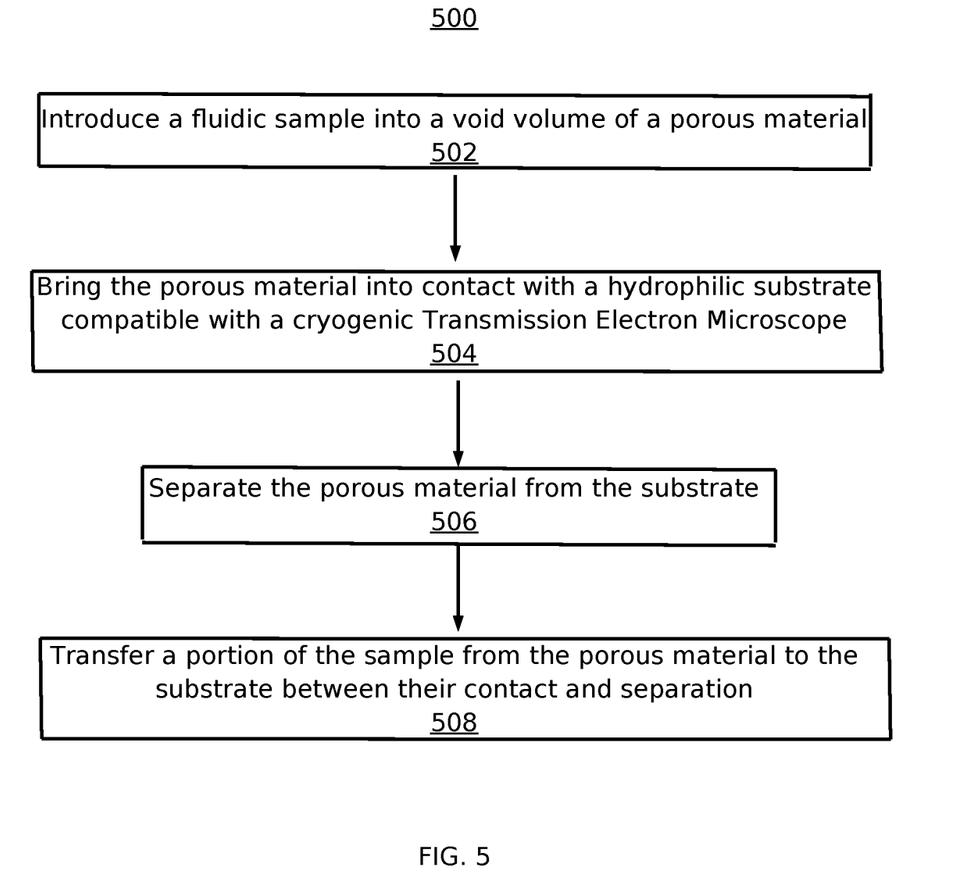
FIG. 5 is a flow diagram.

As shown in FIG. 5, an exemplary process 500 includes introducing (502) a fluidic sample into a void volume of a porous material.

Process 500 brings (504) the porous material into contact with a hydrophilic substrate compatible with a cryogenic Transmission Electron Microscope.

Process 500 separates (506) the porous material from the substrate.

Process 500 transfers (508) a portion of the sample from the porous material to the substrate between their contact and separation.

Figure 6:
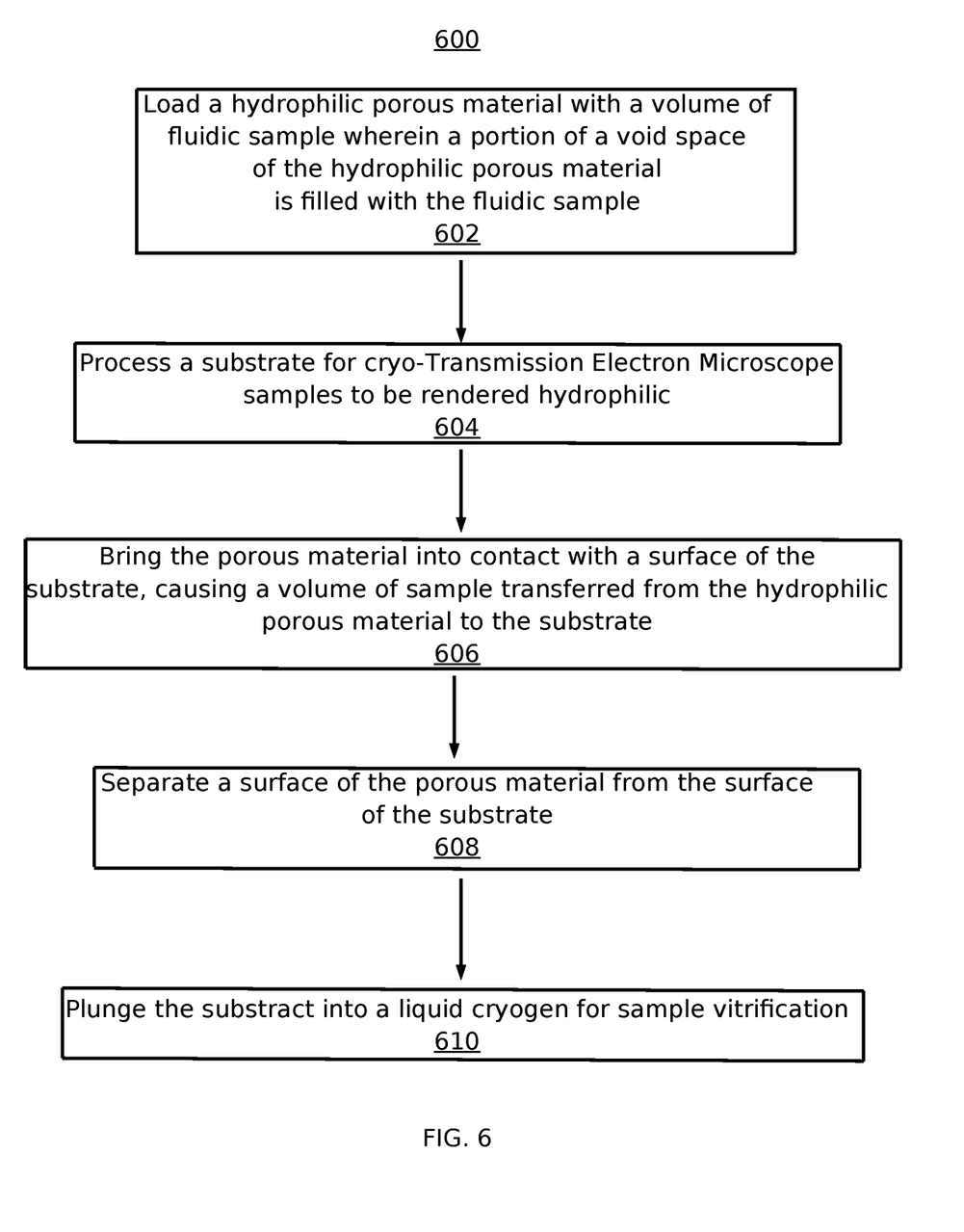
FIG. 6 is a flow diagram.

As shown in FIG. 6, another exemplary process 600 includes loading (602) a hydrophilic porous material with a volume of fluidic sample wherein a portion of a void space of the hydrophilic porous material is filled with the fluidic sample.

Process 600 processes (604) a substrate for cryo-Transmission Electron Microscope samples to be rendered hydrophilic.

Process 600 brings (606) the porous material into contact with a surface of the substrate, causing a volume of sample transferred from the hydrophilic porous material to the substrate.

Process 600 separates (608) a surface of the porous material from the surface of the substrate.

Process 600 plunges (610) the substract into a liquid cryogen for sample vitrification.

It would be appreciated by those skilled in the art that various changes and modifications can be made to the illustrated embodiments without departing from the spirit of the present invention. All such modifications and changes are intended to be within the scope of the present invention except as limited by the scope of the appended claims.

What is claimed is:

1. A method comprising:
   introducing a fluidic sample into a hydrophilic porous material;
   bringing the porous material into contact with a hydrophilic substrate compatible with a cryogenic Transmission Electron Microscope;
   separating the porous material from the substrate; and
   transferring a portion of the sample from the porous material to the substrate between their contact and separation.

2. The method of claim 1 wherein upon separation of the porous material and substrate, the substrate is plunged into liquid cryogen and the fluidic sample is vitrified.

3. The method of claim 2 wherein the portion transferred is appropriate for vitrification for cryo- Transmission Electron Microscope imaging, eliminating a need to remove excess sample volume.

4. A method comprising:
   loading a hydrophilic porous material with a volume of fluidic sample wherein the fluidic sample fills a portion of a void space of the hydrophilic porous material;
   processing a substrate for cryo-Transmission Electron Microscope samples to be rendered hydrophilic;
   bringing the porous material into contact with a surface of the substrate, causing a portion volume of sample to be transferred from the hydrophilic porous material to the substrate;
   separating the porous material from the surface of the substrate; and
   plunging the substrate into a liquid cryogen for sample vitrification.

5. The method of claim 4 wherein the fluidic sample comprises up to 100% of the void space.

6. A method comprising a blotless technique for depositing fluidic sample onto a substrate for cryo-Transmission Electron Microscope-, the blotless technique comprising:
   allowing a volume of fluidic sample to wick into a void space of a hydrophilic porous material;
   processing a substrate for cryo-Transmission Electron Microscope samples to be rendered hydrophilic;
   bringing the porous material into contact with a surface of the substrate, and allowing for relative shearing action between the porous material and substrate causing a portion of volume of sample to be transferred from the hydrophilic porous material to the substrate;
   separating a surface of the porous material from the surface of the substrate; and
   plunging the substrate into a liquid cryogen for sample vitrification.

* * * * *

UNITED STATES PATENT AND TRADEMARK OFFICE
CERTIFICATE OF CORRECTION

| | |
|---|---|
| PATENT NO. | : 11,035,766 B2 |
| APPLICATION NO. | : 16/790367 |
| DATED | : June 15, 2021 |
| INVENTOR(S) | : Michael Godfrin et al. |

It is certified that error appears in the above-identified patent and that said Letters Patent is hereby corrected as shown below:

In the Specification

Column 1, Line 15 reads:
"Grant No. NSF 1746430 awarded by the National Science"
Should read:
--Grant Nos. NSF 1746430 and 1951068 awarded by the National Science--

Signed and Sealed this
Thirtieth Day of July, 2024

Katherine Kelly Vidal
*Director of the United States Patent and Trademark Office*